United States Patent [19]

Storey

[11] Patent Number: 4,647,907
[45] Date of Patent: Mar. 3, 1987

[54] DIGITAL-TO-ANALOGUE CONVERTER INCLUDING CALIBRATED CURRENT SOURCES

[75] Inventor: Michael J. Storey, Cambridge, England

[73] Assignee: Cambridge Consultants Limited, Great Britain

[21] Appl. No.: 769,449

[22] Filed: Aug. 26, 1985

Related U.S. Application Data

[63] Continuation of Ser. No. 375,558, May 6, 1982, Pat. No. 4,591,828.

[30] Foreign Application Priority Data

May 7, 1981 [GB] United Kingdom ............... 8113887
May 7, 1981 [GB] United Kingdom ............... 8113888

[51] Int. Cl.[4] ............................................. H03K 13/02
[52] U.S. Cl. ....................... 340/347 DA; 340/347 CC; 340/347 M; 323/270
[58] Field of Search ............... 340/347 CC, 347 DA, 340/347 SH, 347 M; 323/270, 271

[56] References Cited

U.S. PATENT DOCUMENTS

| | | | |
|---|---|---|---|
| 3,651,517 | 3/1972 | Kurek et al. | 340/347 DA |
| 3,940,760 | 2/1976 | Brokaw | 340/347 M X |
| 4,231,020 | 10/1980 | Azzis et al. | 340/347 DA |
| 4,316,178 | 2/1982 | Shibayama et al. | 340/347 DA |
| 4,335,373 | 6/1982 | Sloane | 340/347 CC |
| 4,336,526 | 6/1982 | Weir | 340/347 AD |
| 4,342,983 | 8/1982 | Weigand et al. | 340/347 CC |

FOREIGN PATENT DOCUMENTS

| | | |
|---|---|---|
| 2254913 | 7/1975 | France. |
| 2386939 | 11/1978 | France. |
| 2447119 | 8/1980 | France. |
| 2034992 | 6/1980 | United Kingdom. |
| 2044566 | 10/1980 | United Kingdom. |

OTHER PUBLICATIONS

Electro-81 Conference Record, vol. 6, Apr. 7-9, 1981, pp. 1-8, New York.
The Engineering Staff of Analog Devices, Inc., Analog-Digital Conversion Handbook, 6/1972, pp. I-2 & I-3; II-46 to II-49; III-1 to III-5.
Wittlinger, Linear Integrated Circuits RCA Application Note ICAN-6668 Applications of the CA3080 and CA3080A High-Performance Operational Transconductance Amplifiers, pp. 1-7.

Primary Examiner—T. J. Sloyan
Attorney, Agent, or Firm—Lerner, David, Littenberg, Krumholz & Mentlik

[57] ABSTRACT

A digital-to-analogue converter includes a plurality of constant current sources and a calibration circuit for measuring the value or relative value of the current provided by one or more of the sources without interrupting operation of the digital-to-analogue converter. The calibration circuit carries out a routine whereby a number of measurements are obtained and averaged. Error signals in accordance with the averaged measurements are produced and used to correct for drift in the components of the current sources. Error correction may be achieved by adjusting the regulators themselves or by adding correction signals at other parts of the circuit.

14 Claims, 6 Drawing Figures

DIGITAL-TO-ANALOGUE CONVERTER INCLUDING CALIBRATED CURRENT SOURCES

This is a continuation, of application Ser. No. 375,558, filed May 6, 1982 now U.S. Pat. No. 4,591,828.

FIELD OF THE INVENTION

The invention relates to digital to analogue converters and to current regulators which may be used in such converters or in other applications.

BACKGROUND

A digital-to-analogue converter (DAC) generates an analogue quantity, such as a current, in response to a digital code. The DAC is normally divided into a number of segments each of which generates a quantity in proportion to the weight of the bit in the code corresponding to the segment. The total analogue quantity is the sum of the separate quantities generated at the output from each segment in response to the input code.

The analogue quantity generated at the output from each segment has to be maintained in a precise ratio relative to that in other segments in proportion to the relative code weight, in order that the linearity of the DAC be maintained. The most critical factor, when circuits which compensate other sources of error are adopted, is the resistance of the reference resistors in each segment. In particular, the resistance values of resistors are known to drift differentially both with operating temperature and with time due to aging. Such drift limits the precision of the analogue quantities generated and so the precision that can be ascribed to a DAC.

The best (technologically realistic) resistors currently available have temperature tracking coefficients of the order of 1 ppm per °C. A DAC specified as operable over a range of ±50° C. will therefore be limited to 14 bit accuracy using such resistors, and the temperature of a DAC capable of 20 bit accuracy needs to be controlled to better than 1° C. The need to avoid such operating temperature limits, against a background of increasing accuracy requirements to match progress in data processing technology has given rise to the requirements for self-calibrating DACs to compensate reference resistor drift.

It is one objective of the present invention to provide a current source for a segment of a DAC in which the source current, made available by the segment in response to a digital code, is also continuously available for measurement. A further objective is to be able to alter the source current in the event of drift, so that the current in each segment can be maintained in a fixed or a known ratio relative to that in the other segments in response to measurements made on the current independently of the supply of current in the current source.

The present invention in one aspect comprises a current source for a digital-to-analogue converter (DAC) including an analogue current source, in which the DECS comprises a first source port which makes available a current to the current source and a second measurement port which makes available a current for measurement. Preferably the current available in the source port in the current source is equal to the current in the measurement port to within less than one least significant resolved bit of the DAC. In a further aspect of the invention the current source for a digital-to-analogue converter (DAC) comprises first and second current ports which allow delivery and measurement of current at the same time.

The present invention in a further aspect comprises a current source for a digital-to-analogue converter (DAC) as illustrated in FIG. 1 or described below. In one particular aspect the current source includes voltage controlled devices, such as an operational amplifier or a transconductance amplifier and a field effect transistor.

The present invention in a further aspect comprises a digital-to-analogue converter (DAC) having one or more switchable current sources having a predetermined current magnitude using a current source, in which the accuracy of the predetermined current in the source port is achieved by repeated correction in consequence of measurement of the current in the measurement port. In one configuration of the current source, correction is accomplished by repeated alteration of a reference voltage to compensate drift in the current source. In another configuration correction is accomplished by repeated alteration of a reference resistor to compensate drift in the current source.

In a further aspect of the invention, a digital-to-analogue converter (DAC) includes one or more switchable current sources having a predetermined current magnitude, in which accuracy of the predetermined current is achieved by measurement of the current in the measurement port of a current source and application of a correction digital code to a subsidiary digital-to-analogue converter which adds or subtracts a correction current to the current in the source port of the current source.

In a further aspect of the invention an analogue-to-digital converter (ADC) of the successive approximation type, incorporating single bit or multiple bit comparators or an ADC of the serial or serial/parallel type, includes a DAC using one or more switchable current sources having a predetermined current magnitude, comprising a current source in which current is available for measurement and for application in the DAC at the same time. Preferably the predetermined current is measured and corrected as indicated in the two paragraphs above.

In a further aspect of the invention there is provided a DAC including a current source having a current measurement port and a current source port, in which measurement of the current is made at the measurement port and information being a quantitative (digital) representation of the current at the source port is stored in a storage register and the information is used to correct or compensate for drift in the source current.

In a further aspect of the invention a non-binary DAC incorporates switchable current sources, including one or more current source in which the current magnitudes after consideration of the maximum expected drifts over the period of use of the DAC, are deliberately chosen so that the ratios of the magnitudes of adjacent currents are less than 2, and the most critical non-binary current magnitudes are measured and information being a quantitative (digital) representation of said currents are stored in a storage register. Further the invention includes an analogue-to-digital converter which comprises a non-binary DAC and a storage register which stores digital codes representative of the magnitudes of currents in the DAC.

The invention also concerns in another aspect, calibration circuits which may be used in a DAC. The precision of a self-calibrating DAC is specified by the precision of its calibrating circuit. When such a circuit is used to measure the relative magnitudes of the analogue quantities, for example, the currents, in each segment of the DAC the measured values can be used to restore the binary ratios periodically and compensate thermal drift or aging. Alternatively, in an analogue-to-digital converter (ADC) using a DAC, the multibit digital codes which are found by measurement to be the digital equivalents of the analogue quantities can be summed in the sequence designated by the comparator circuit to obtain the digital output code directly, without maintaining exact binary ratios between the segments in the event of drift.

The calibration circuits used normally comprise a capacitor and a stable current source which together generate a ramp voltage. The analogue outputs of the DAC are compared in sequence with the ramp voltage to measure their instantaneous values against a time base. It is recognised that serious accuracy problems are inherent in such circuits. Dielectric absorption in the capacitor, for example, has the effect that the instantaneous voltage across it is not truly proportional to the charge stored in it, the relationship in general being multi-modal. The delays, voltage offsets and common mode performance which are characteristic of amplifiers or comparators in the circuits also tend to vary owing to the fact that each reading is taken at a different voltage level of the ramp. Such component non-linearities or imperfections limit the measurement accuracy which may be ascribed to the calibration circuit. Drift and thermal noise in the components may also be the cause of measurement differences, particularly if the accuracy of a DAC exceeds 16 bits.

Another objective of the present invention is to provide a calibration circuit for a DAC, which is configured and operated so as to compensate or eliminate the significant measurement errors. These arise specifically from a multimodal ramp voltage characteristic from delays, voltage offsets or common mode performance which are characteristic of the circuit components, as well as from drift or noise which occurs between successive readings. A further objective is to provide a calibration circuit for a self-calibrating DAC, or for an ADC using a self-calibrating DAC, having a precision exceeding twenty significant bits.

According to a further aspect of the present invention, a calibration circuit for the set of current sources for a digital-to-analogue converter (DAC) comprises a resistor through which successively incremented current outputs of the DAC are during a period supplied to the output terminal of an integrator, a constant voltage source which applies a datum voltage to the non-inverting input terminal, and a constant current source which during the period supplies current to the inverting input terminal of the integrator. The integrator collects current at its output terminal to maintain its inverting input terminal to the datum voltage. The current increments correspond to an increase or decrease of the digital code applied to the DAC by one least significant bit.

According to a further aspect of the invention a calibration circuit for the set of current sources for a digital-to-analogue converter (DAC) comprises a comparator which compares the voltage at the resistor input terminal with the datum voltage during the application of successively incremented current outputs of the DAC applied to the circuit during the period, initiates the storage of a clock count record each time the comparator voltage difference reduces to a preselected or zero value, and initiates from the DAC the application of the incrementally next higher or lower source current. Preferably there are applied to the calibration circuit $2^N$ successively incremented current outputs from a set of N current sources in the DAC and $2^N$ clock count records are thereby obtained in the period.

In a further aspect of the invention there are obtained $2^N$ clock count records from a set of N current sources in the calibration circuit during each period, and an estimate of the relative magnitude of the current in each source is obtained from the average of the $2^{N-1}$ count values derived in each period corresponding to that current increment.

In a further aspect of the invention the sign of the current applied to the integrator input terminal is alternately reversed in successive periods of use of the calibration circuit and the estimate of the relative magnitude of the current in each source is obtained from the average of $2^{N-1}$ count values derived in each of (two) such periods. Preferably the estimates of the relative magnitudes of the currents in the current sources, derived from the average of $2^{N-1}$ values of the clock count in each period, are scaled to normalise the estimate corresponding to the greatest current source.

In a further aspect of the invention the estimated currents derived in each period or each two successive periods are each further averaged recursively to present progressively latest best estimates of the relative magnitudes of the currents in the current sources.

THE DRAWINGS

The invention is described further by way of example with reference to the accompanying drawings in which.

Figure 1:
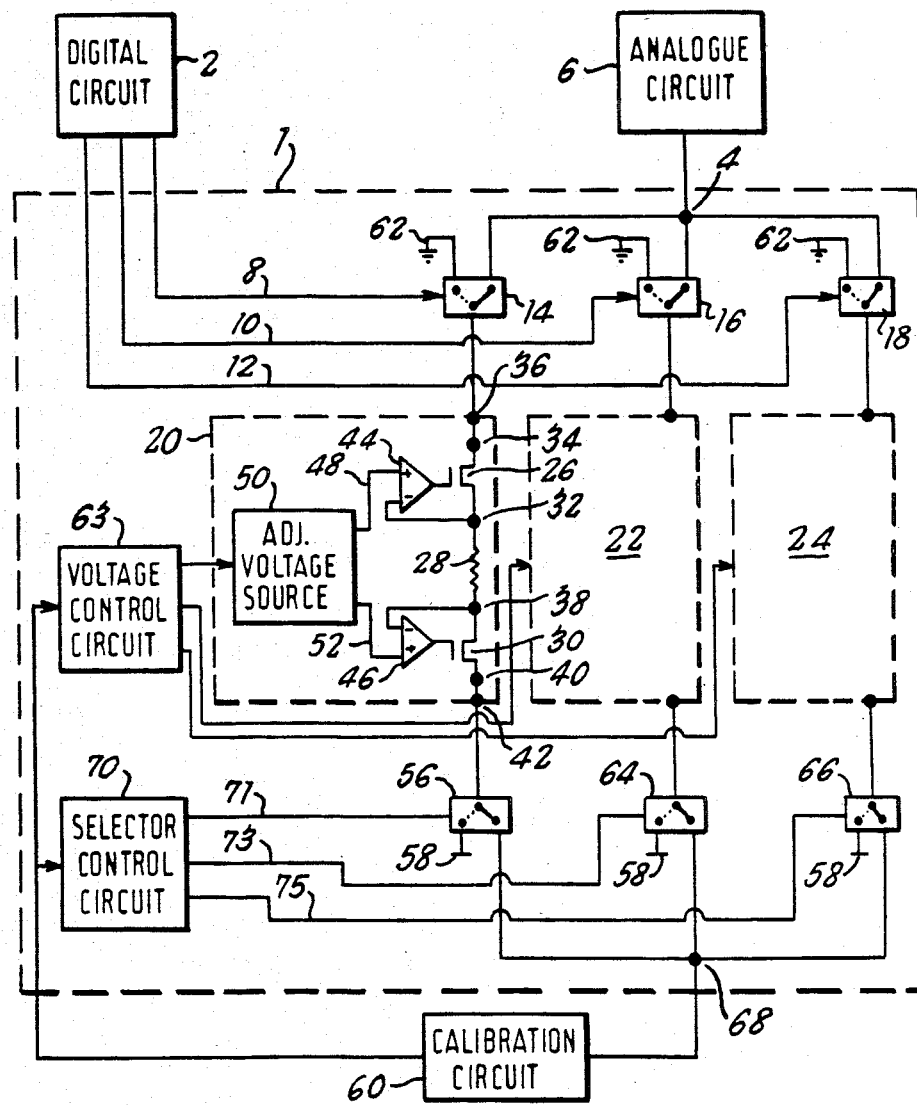
FIG. 1 is a diagram of a circuit including a digital-to-analogue converter in accordance with an embodiment of the present invention.

With reference to FIG. 1 digital-to-analogue converter 1 receives from a digital circuit 2 digital words which are to be converted to an analogue signal at summing junction 4 of the converter for supply to an analogue circuit 6. For simplicity, FIG. 1 only shows the circuitry for converting three bits of the digital words produced by circuit 2 to analogue form. These three bits are provided by circuit 2 to lines 8, 10 and 12 which are connected to selector circuits 14, 16 and 18 respectively so that, when a digital 1 appears on a line 8, 10 or 12, the associated selector circuit 14, 16 or 18 supplies to the summing junction 4 a current, weighted according to the significance of the bit, from an associated current regulator 20, 22 or 24.

Current regulator 20 comprises an n-channel FET 26, a resistor 28 and a p-channel FET 30 all connected in series. The FET 26 has its source 32 and drain 34 connected respectively to the resistor 28 and a terminal 36; and the FET 30 has its source 38 connected to resistor 28 and its drain 40 connected to terminal 42. The FET's 26 and 30 may be j-FET's or MOSFET's.

Accordingly, current may flow from the terminal 36 to the terminal 42 under control of the FET's 26 and 30. For effecting this control, operational amplifiers 44 and 46 are provided. These are preferably low input bias current operational amplifiers or low input bias current transconductance amplifiers. These amplifiers and the FETs 26 and 30 are characterised by low bias leakage currents. Amplifier 44 has its output connected to the gate of FET 26, its negative input connected to the source 32 of FET 26 and its positive input connected to one terminal 48 of an adjustable DC voltage source 50. The amplifier 46 has its output connected to the gate of FET 30, its negative input connected to the source 38 of FET 30 and its positive input connected to the other terminal 52 of adjustable voltage source 50 which thus applies, between the positive inputs of the amplifiers 44 and 46, a DC voltage whose magnitude can be adjusted by adjustment of the source 50.

Terminal 42 is connectable, via a selector circuit 56 to either a current sink 58, at a negative voltage, or to a calibration circuit 60. The arrangement of the FETs 26 and 30 and amplifiers 44 and 46 in the current regulator 20 is such that the current flowing between terminals 36 and 42 remains invariant irrespective of whether the selector 14 connects terminal 36 to the summing junction 4 or to a ground connection 62 and irrespective of whether selector 56 connects terminal 42 to the current sink or to the calibrator 60. With the arrangement shown, the current flowing from terminal 42 is substantially equal to that flowing into terminal 36 from the summing function 4 since there is little current loss in the FETs 26 and 30 and little current flow into the negative inputs of the amplifiers 44 and 46. With properly chosen low bias current amplifiers and low leakage current FETs, the loss may be as low as 1 part in $10^8$. Measurement of the current flowing out of the terminal 42 therefore provides an accurate measure of the current flowing from the summing junction 4 to the terminal 36 and since these currents remain constant regardless of the condition of the selectors 14 and 56, this measurement can be made at any time i.e., without interruption of the digital to analogue conversion, by connecting the terminal 42 to the calibration circuit 60 via the selector 56. Accordingly such measurements can be periodically made and in the event of variation in the measured current due, for example, to drift of the resistor 28, the current can be corrected by changing the voltage applied by the voltage source 50 between the positive inputs of the amplifiers 44 and 46. This voltage change is achieved by a control device 63 which generates a correction voltage in response to a signal from the calibration circuit 60. Although current regulators 22 and 24 are not shown in detail, their construction is identical to that of current regulator 20 except that the resistors 28 of the current regulators 20, 22 and 24 are weighted to provide the required weighted currents to the summing junction 4. Thus, the resistor 28 (not shown) of voltage regulator 22 should have a resistance value as close as possible to twice that of the resistor 28 of current regulator 20 and the resistor 28 (not shown) of current regulator 24 should have a value as close as possible to twice that of the resistor 28 (not shown) of current regulator 22. As a result, the current regulator 20 provides the current corresponding to the most significant bit of the digital word from circuit 2 and current regulators 22 and 24 provide currents corresponding to the next two bits of lower significance. Although only three current regulators are shown in FIG. 1 there will normally be N current regulators for an N bit digital-to-analogue converter although the regulators corresponding to the bits of low significance need not be of the construction shown.

The current regulators 22 and 24 are also connectable, via selectors 64 and 66 to either the current sink 58 or the calibration circuit 60, the latter via a summing junction 68 to which the selector 56 is also connected. The selectors 56, 64 and 66 are controlled by a control circuit 70 in response to instructions from the calibration circuit 60.

Figure 2:
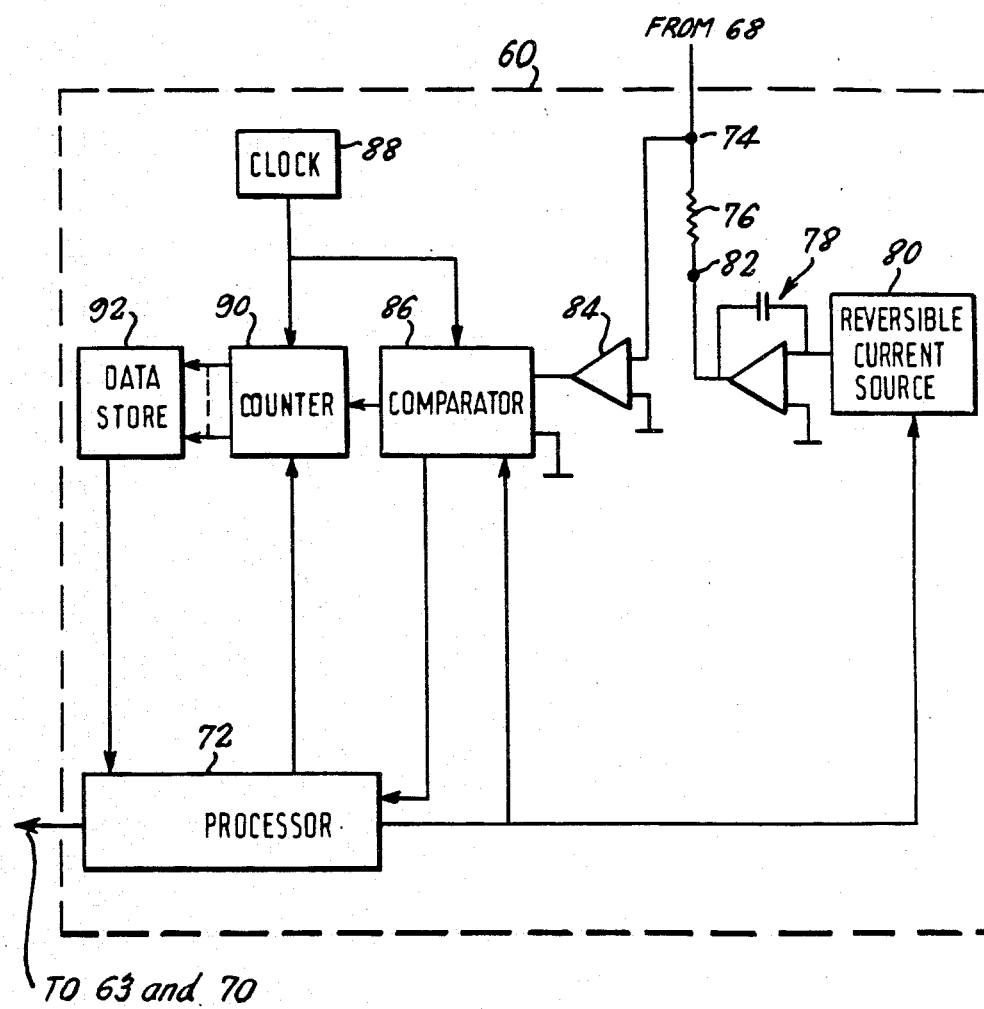
FIG. 2 shows in more detail part of the circuit shown in FIG. 1.
Figure 3:
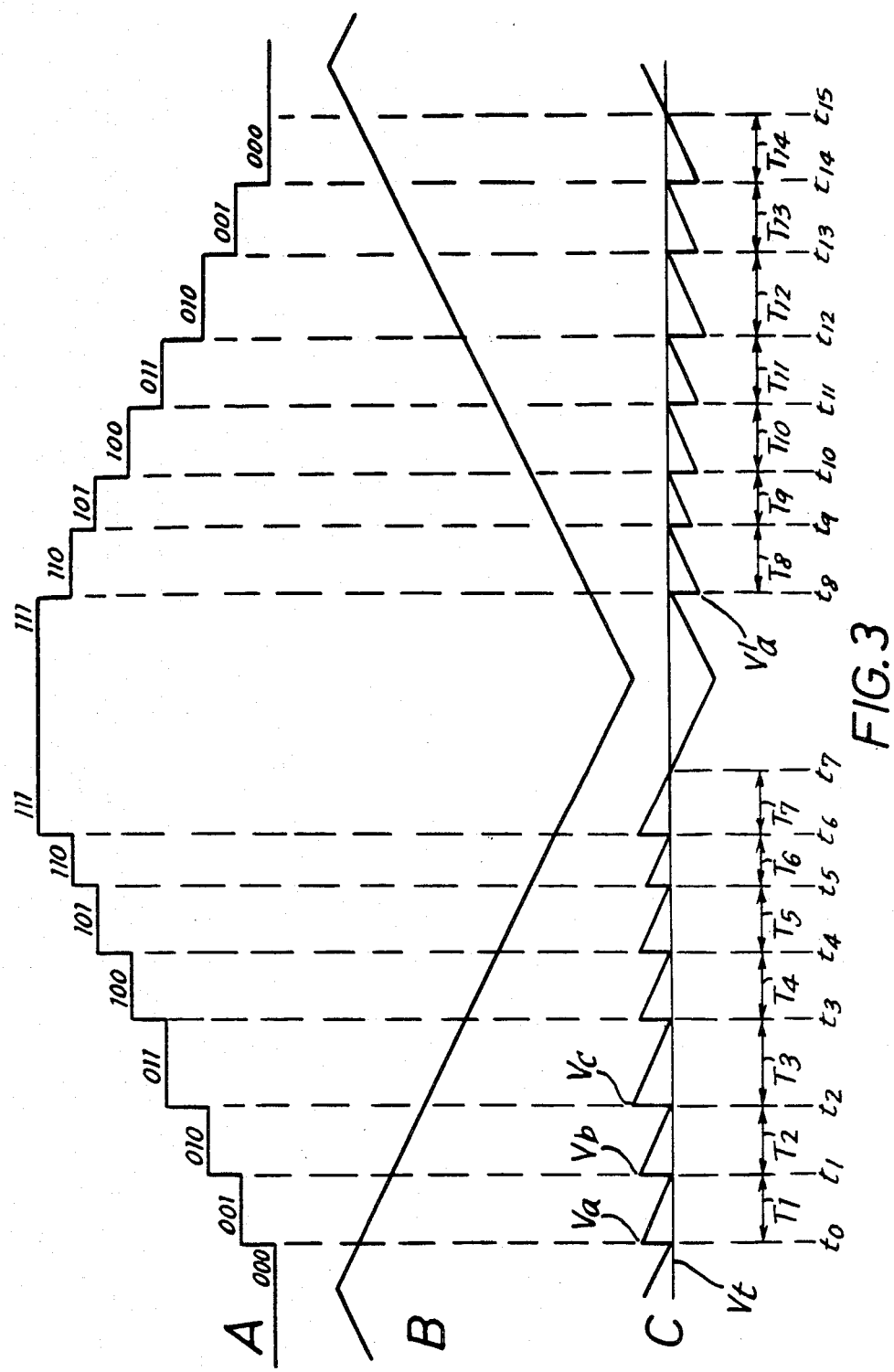
FIG. 3 is a waveform diagram illustrating operation of the part of the circuit shown in FIG. 2.

The embodiment of FIGS. 1 to 3 is operated in accordance with a calibration routine which causes numerous measurements of relative magnitudes of the current to be taken in one measurement cycle. Adjustments of the current regulators are then carried out in accordance with the average values obtained.

With particular reference to FIGS. 2 and 3, the calibration circuit 60 includes a processor 72 which controls the circuit 70 to output, on its output lines 71, 73 and 75 which are connected respectively to the selectors 56, 64 and 66, a binary number. At that start of a calibration routine this is set at 000 and is then successively incremented by unity so that the current supplied to the calibration circuit 60 via the summing junction 68 successively represents the numbers in the sequence 000, 001, 010 ... 111. After the number has reached the value 111, it is successively decremented by unity so that the current flowing from the summing junction 68 to the calibration circuit 60 is succesively reduced through values representing the succession of binary numbers 111, 110 ... 000. This stepwise increase and decrease in this current is illustrated in waveform A of FIG. 3 which shows that the current is of staircase waveform. The staircase waveform current of FIG. 3A is applied to one terminal 74 at one end of a resistor 76 included in the calibration circuit. The other end of the resistor 76 is connected to an integrator 78 having its input connected to a reversible current source 80. The processor 72 controls the current source 80 so that, while the staircase waveform of FIG. 3 is increasing, a decreasing ramp voltage appears at the terminal 82 of resistor 76 and, when the staircase waveform of FIG. 3 is decreasing, an increasing ramp voltage appears at terminal 82. These ramp voltages are illustrated in waveform B of FIG. 3. As a consequence, the voltage appearing at terminal 74 of resistor 76 is, as shown in waveform C of FIG. 3, of sawtooth form representing effectively the sum of waveforms (A) and (B) of FIG. 3. The waveform (C) of FIG. 3 is amplified and clipped in a circuit 84. The output of the circuit 84 is applied to a comparator circuit 86.

The increasing and decreasing ramp voltage of waveform B of FIG. 3 is continuously generated. Prior to the beginning of each measuring routine, as previously indicated, the number output by circuit 70 is 000 and this number is output during a time when the ramp voltage is near its maximum. The measuring routine begins at time $t_0$ when the voltage at terminal 74 falls to a threshold value $V_t$. This is detected by the comparator circuit 86. In response to this detection, the number in a counter 90, which counts pulses from a clock 88, is stored in a data store 92 under control of the processor 72 which also causes the circuit 70 to output 001 at time $t_0$. The current flowing from the summing junction 68 to the calibration circuit 60 steps up from zero to a value equal to that flowing through current regulator 24 so that the voltage at terminal 74 steps up by a value indicated in waveform C of FIG. 3 as $V_a$, which is proportional to the current through regulator 24. Due to the ramp generated by the integrator 78 and current source 80, the voltage at terminal 74 decreases at a rate equal to the slope of the ramp and at time $t_1$ again reaches the level $V_t$. The time from $t_0$ to $t_1$ taken for the voltage at terminal 74 to decrease to $V_t$ is a measure of the magnitude of voltage step $V_a$ and therefore a measure of the current flowing through the current regulator 24. The comparator circuit 86 detects the arrival of the voltage at the threshold level $V_t$ at $t_1$. At this time processor 72, in response to the signal from the comparator circuit 86, again transfers the number in counter 90 into the data store 92, and again causes the circuit 70 to increment by unity the number output on lines 71, 73 and 75 to 010 so that the summing junction 68 receives current from current regulator 22 which, if the circuit is correctly calibrated, will be twice the current flowing through regulator 24. Accordingly, the voltage at terminal 74 is again stepped up, this time by a value $V_b$ which is dependent on the current flowing through the regulator 22. The voltage at terminal 74 again decends through the value $V_b$ at a rate determined by the voltage gradient at terminal 82 and reaches the threshold level $V_t$ again at time $t_2$. At $t_2$ the processor 72 again transfers the count from counter 90 to data store 92 and again increments by unity the number output by circuit 70 to a value 011. This then causes the summing junction 68 to supply to the calibration circuit 60 a current equal to the sum of the currents through the regulators 22 and 24 so that at time $t_2$, the voltage at terminal 74 is increased by a value $V_c$ dependent upon the sum of the currents through the regulators 22 and 24. The process continues as shown in FIG. 3 until the data store 90 has stored the values which were in counter 90 at each of the times $t_0$ to $t_7$. Thereafter the processor 72 changes the polarity of the current source 80, decrements by unity the number output by the circuit 70 so that at time $t_8$ the voltage at terminal 74 steps down by a value $V'_a$ and then rises in accordance with the positive going ramp generated by the integrator 78. The processor, when changing the polarity of current source 80 also switches the comparator circuit 86 to a condition to detect when the rising voltage of waveform (C) of FIG. 3 reaches the threshold level $V_t$. Each time the voltage at terminal 74 reaches the threshold level $V_t$, the processor 72 stores the number in counter 90 in data store 92 and decrements by unity the number output by the circuit 70. Accordingly, after the binary number output by the circuit 70 has been decremented to 000 the data store contains the values which were in counter 90 at each of times $t_0$ to $t_{15}$. From this data, the periods $T_1$ to $T_{14}$ between $t_0$ and $t_1$, $t_1$ and $t_2$ etc. can be calculated. If the currents flowing through each of the current regulators 20, 22 and 24 are respectively $i_1$, $i_2$ and $i_3$ then the following Table I illustrates the current flowing from the summing junction 68 to the calibration circuit 60 in each of the time periods $T_1$ to $T_{14}$:

TABLE I

| INTERVAL | SUM CURRENTS FLOWING TO CALIBRATION CIRCUIT 60 | | | | |
|---|---|---|---|---|---|
| $T_1$ | 0 | + | 0 | + | $i_3$ |
| $T_2$ | 0 | + | $i_2$ | + | 0 |
| $T_3$ | 0 | + | $i_2$ | + | $i_3$ |
| $T_4$ | $i_1$ | + | 0 | + | 0 |
| $T_5$ | $i_1$ | + | 0 | + | $i_3$ |

TABLE I-continued

| INTERVAL | SUM CURRENTS FLOWING TO CALIBRATION CIRCUIT 60 | | | | |
|---|---|---|---|---|---|
| $T_6$ | $i_1$ | + | $i_2$ | + | 0 |
| $T_7$ | $i_1$ | + | $i_2$ | + | $i_3$ |
| $T_8$ | $i_1$ | + | $i_2$ | + | 0 |
| $T_9$ | $i_1$ | + | 0 | + | $i_3$ |
| $T_{10}$ | $i_1$ | + | 0 | + | 0 |
| $T_{11}$ | 0 | + | $i_2$ | + | $i_3$ |
| $T_{12}$ | 0 | + | $i_2$ | + | 0 |
| $T_{13}$ | 0 | + | 0 | + | $i_3$ |
| $T_{14}$ | 0 | + | 0 | + | 0 |

The length of each of time periods $T_1$ to $T_{14}$ is a measure of the difference between the current which flows during any given time period and that which flowed during the preceding time period. Accordingly, the values represented by the length of the time periods are shown in Table II:

TABLE II

| INTERVAL | CURRENTS REPRESENTED THEREBY |
|---|---|
| $T_1$ | $i_3$ |
| $T_2$ | $i_2 - i_3$ |
| $T_3$ | $i_3$ |
| $T_4$ | $i_1 - (i_2 + i_3)$ |
| $T_5$ | $i_3$ |
| $T_6$ | $i_2 - i_3$ |
| $T_7$ | $i_3$ |
| $T_8$ | $i_3$ |
| $T_9$ | $i_2 - i_3$ |
| $T_{10}$ | $i_3$ |
| $T_{11}$ | $i_1 - (i_2 + i_3)$ |
| $T_{12}$ | $i_3$ |
| $T_{13}$ | $i_2 - i_3$ |
| $T_{14}$ | $i_3$ |

It follows that eight values for each of the currents $i_1$, $i_2$, $i_3$ may be obtained from the computations carried out on the different time period $T_1$ to $T_{14}$, as shown in Table III:

TABLE III

| CURRENT | MEASURE OF CURRENT GIVEN BY: | | | | | | |
|---|---|---|---|---|---|---|---|
| $i_1$ | $T_1$ | + | $T_2$ | + | $T_3$ | + | $T_4$ |
|  | $T_2$ | + | $T_3$ | + | $T_4$ | + | $T_5$ |
|  | $T_3$ | + | $T_4$ | + | $T_5$ | + | $T_6$ |
|  | $T_4$ | + | $T_5$ | + | $T_6$ | + | $T_7$ |
|  | $T_8$ | + | $T_9$ | + | $T_{10}$ | + | $T_{11}$ |
|  | $T_9$ | + | $T_{10}$ | + | $T_{11}$ | + | $T_{12}$ |
|  | $T_{10}$ | + | $T_{11}$ | + | $T_{12}$ | + | $T_{13}$ |
|  | $T_{11}$ | + | $T_{12}$ | + | $T_{13}$ | + | $T_{14}$ |
| $i_2$ | $T_1$ | + | $T_2$ | | | | |
|  | $T_2$ | + | $T_3$ | | | | |
|  | $T_5$ | + | $T_6$ | | | | |
|  | $T_6$ | + | $T_7$ | | | | |
|  | $T_8$ | + | $T_9$ | | | | |
|  | $T_9$ | + | $T_{10}$ | | | | |
|  | $T_{12}$ | + | $T_{13}$ | | | | |
|  | $T_{13}$ | + | $T_{14}$ | | | | |
| $i_3$ | $T_1$ | | | | | | |
|  | $T_3$ | | | | | | |
|  | $T_5$ | | | | | | |
|  | $T_7$ | | | | | | |
|  | $T_8$ | | | | | | |
|  | $T_{10}$ | | | | | | |
|  | $T_{12}$ | | | | | | |
|  | $T_{14}$ | | | | | | |

As previously indicated, for proper operation of the digital-to-analogue converter, the following relationship should hold:
$i_1 = 2i_2$
$i_2 = 2i_3$ The processor computes a number of values for each of $i_1$, $i_2$ and $i_3$ from the equations shown in the above table, averages the values for each of the currents, and determines the correction necessary to ensure that the above relationships between $i_1$, $i_2$ and $i_3$ are satisfied. Appropriate signals are then transmitted to the voltage control circuit 63 which in turn controls the current regulators 20, 22 and 24.

It should be noted that although the curve (B) of FIG. 3 has been shown as a straight line, in practice there will be some non-linearity. When the curve is falling, as during the time from $t_0$ to $t_7$ this non-linearity will result in errors of one sense in the time periods $t_1$ to $t_7$ whereas when the ramp voltage of curve (B) is rising, as during the period from time $t_8$ to time $t_{14}$ the non-linearity of the ramp voltage will be such that errors in periods $T_8$ to $T_{14}$ are of the opposite sense. Thus, this non-linearity is compensated for by carrying out the process illustrated in FIG. 3.

The calibration current described measures time intervals and computes the relative magnitudes of the currents in the DAC. These enable the linearity of the DAC to be known and controlled. By introducing an independent calibrated current source, such as a secondary standard, and measuring this current at the same time the accuracy as well as the linearity of the DAC can be controlled.

The circuit is arranged so that the voltages and ramp slope are the same in each rising and falling period of the calibration, so that the voltage offsets in the amplifiers and the delays in the amplifier 84 and comparator 86 are identical and result in a constant shift in count values. Such errors do not therefore influence the computed currents.

The DAC in the above example contains N=3 current regulators, and each current is derived from the averaging of eight time periods. In general in an N-bit DAC, the greater the number of bits precision, the more information is obtained in the above calibration routine to estimate each current. In each calibration period the average of each current is derived from $2^N$ count values.

Noise is a significant factor in the manufacture of current ratios of a DAC particularly when more than 20 bits resolution is sought. The averaging of $2^N$ values has the effect of reducing noise in the current estimate in a calibration period of a factor of $\sqrt{2^N}$. In the present calibration routine, if N=20 noise is lowered by about a thousand times compared with its magnitude when each current is measured only once.

The calibration circuit can be employed in a DAC, whether the ratio of adjacent currents is exactly 2:1 or whether the ratios are allowed to depart from 2.

Figure 4:
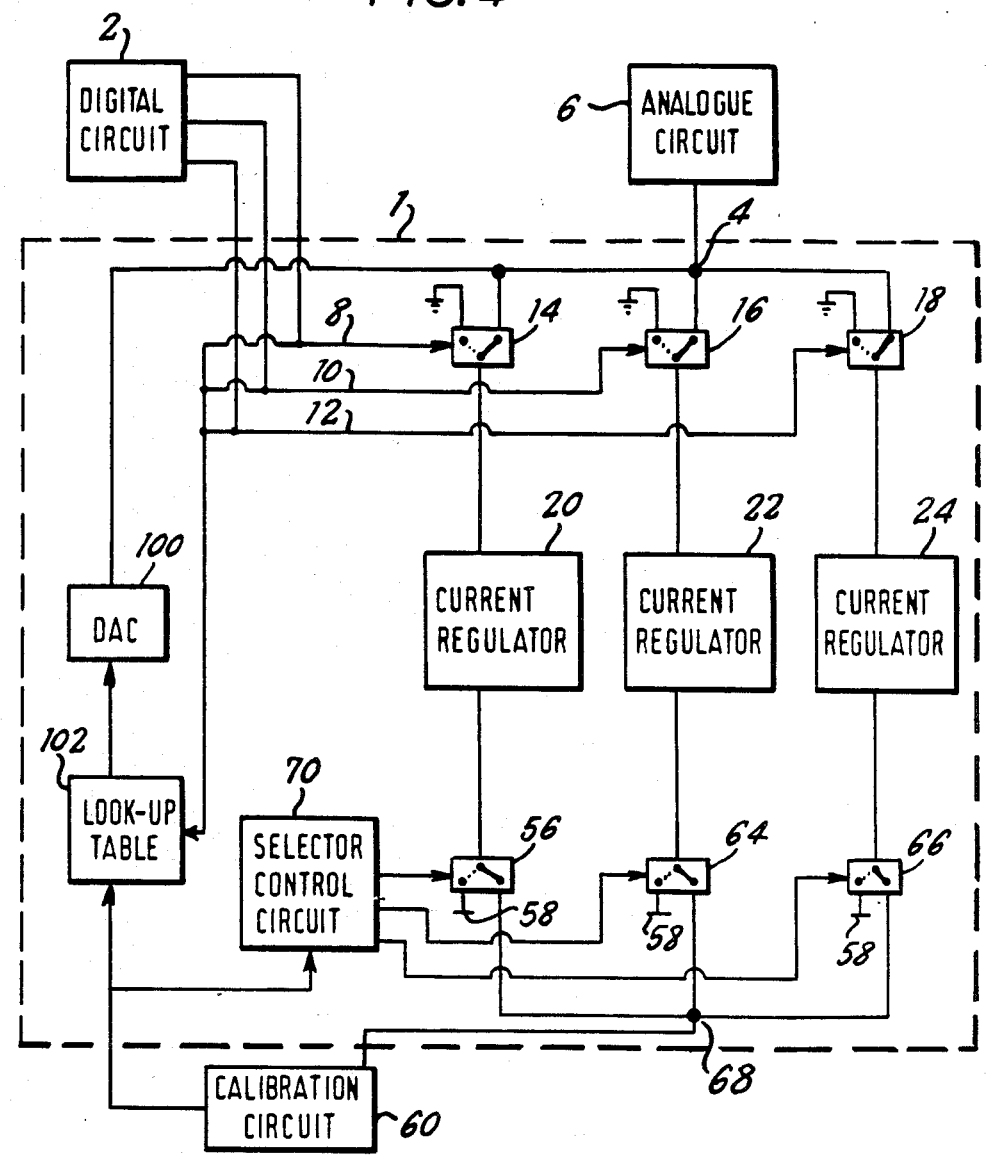
FIG. 4 is a diagram similar to FIG. 1, showing a further embodiment of the invention.

In FIG. 4, the reference numbers which correspond to those shown in FIG. 1 illustrate corresponding elements. However this embodiment differs from that of FIGS. 1 to 3 in that when errors in the currents $i_1$, $i_2$ and $i_3$ are detected by the calibration circuit, an auxiliary digital-to-analogue converter 100 generates an analogue correction signal which is applied to summing junction 4 in order to correct the error, instead of making separate adjustments in the current regulators 20, 22 and 24. Accordingly, the voltage control circuit 63 of FIG. 1 is omitted and the adjustable voltage sources 50 of the regulators 20, 22 and 24 are pre-set. The magnitude of the analogue correction signal required depends not only upon the errors in the currents $i_1$, $i_2$ and $i_3$ but also upon the digital word output by the circuit 2. Accordingly, this word is applied to a look up table 102 which also receives a digital correction signal from the calibration circuit 60. The look up table 102 generates a digital output, converted to analogue form in the digital to analogue convertor 100, in dependence upon the word output by the digital circuit 2 and the error signal output by the calibration circuit 60.

Figure 5:
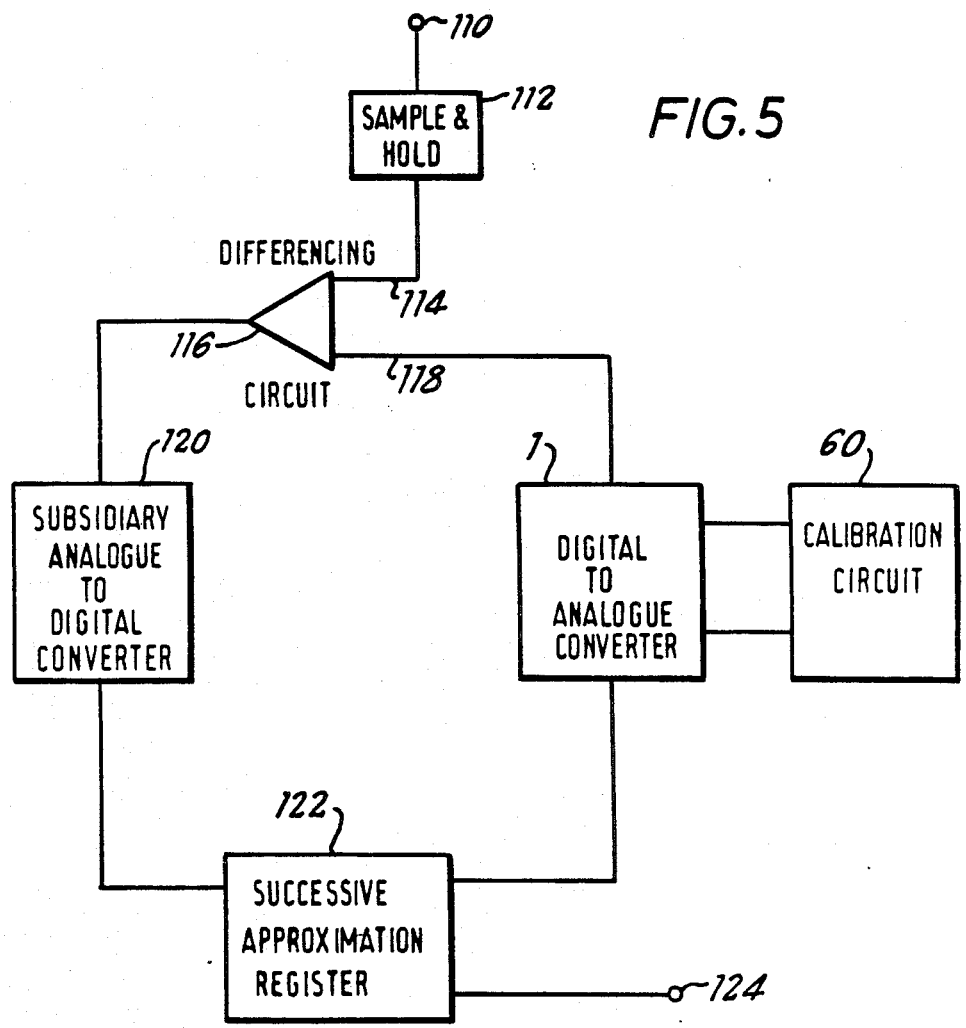
FIG. 5 illustrates a first form of analogue-to-digital converter including a digital to analogue converter according to the present invention.

FIG. 5 illustrates an embodiment of the invention in an analogue-to-digital converter. The analogue signal to be converted to digital form is applied to an analogue input terminal 110 and stored in a sample and hold circuit 112. The sample stored in the circuit 112 is applied to one input 114 of a differencing circuit 116, the other input 118 of which receives an analogue signal output by a digital-to-analogue converter 1 calibrated by a calibration circuit 60. The converter 1 and calibration circuit 60 are in accordance with FIGS. 1 to 3 or FIG. 4. The differencing circuit 116 produces an analogue error signal which is applied to subsidiary analogue-to-digital converter 120 which converts this error signal to digital form and applies it to a successive approximation register 122. The successive approximation register outputs a digital word which is changed in accordance with a predetermined algorithm, in response to the value of the digital error signal produced by the subsidiary analogue-to-digital converter 120 and the previous digital word produced by the successive approximation register 122. The digital word output is applied to the digital-to-analogue converter 1. After a number of cycles, the algorithm reduces the error signal produced by the differencing circuit 116 to substantially zero. When this has been achieved, the number in the successive approximation register is a representation of the magnitude of the analogue input sample in circuit 112 and is applied to digital output 124. This output is more accurate than is obtained in prior ADC's due to the static accuracy of the calibrated DAC 1.

The speed at which analogue-to-digital converters can operate accurately is limited partly by the time taken for the signals generated within the circuit to settle down following each change. Thus, for example, each time a new sample is put into the sample and hold circuit 112, a finite time elapses before the circuit settles down to within one least significant bit of equilibrium value and the sample can be measured. Further, each time the successive approximation register 122 generates a new binary number as the algorithm proceeds, which number is converted to analogue from by the calibrated DAC 1, a finite time is required for the circuit to settle down to within one least significant but when operation of the differing circuit 116 can proceed. Noise is also present in the analogue circuit. Accordingly, as speed of operation is increased, or the number of bits is increased, the risk of errors in the analogue part of the circuit is increased. Error principally arises in the comparison taking place with the aid of the differencing circuit 116. At each step in the successive approximation algorithm the differencing circuit 116 effectively takes a decision as to whether the analogue signal applied to input 118 is greater or less than that applied to input 114. If, for example, at a particular stage the differencing circuit 116 makes an error and indicates that the signal at input 118 is less than that at input 114, whereas in fact it is greater, the successive approximation algorithm will cause the register 122 to output a larger binary number to the converter 1 so as to increase the magnitude of the analogue signal produced thereby. Subsequently, due to the aforementioned error, the correct value for the digital signal cannot be recovered and it follows that unless the algorithm is repeated the particular sample stored in the circuit 112 at the time the error was made will never be converted to digital form.

Figure 6:
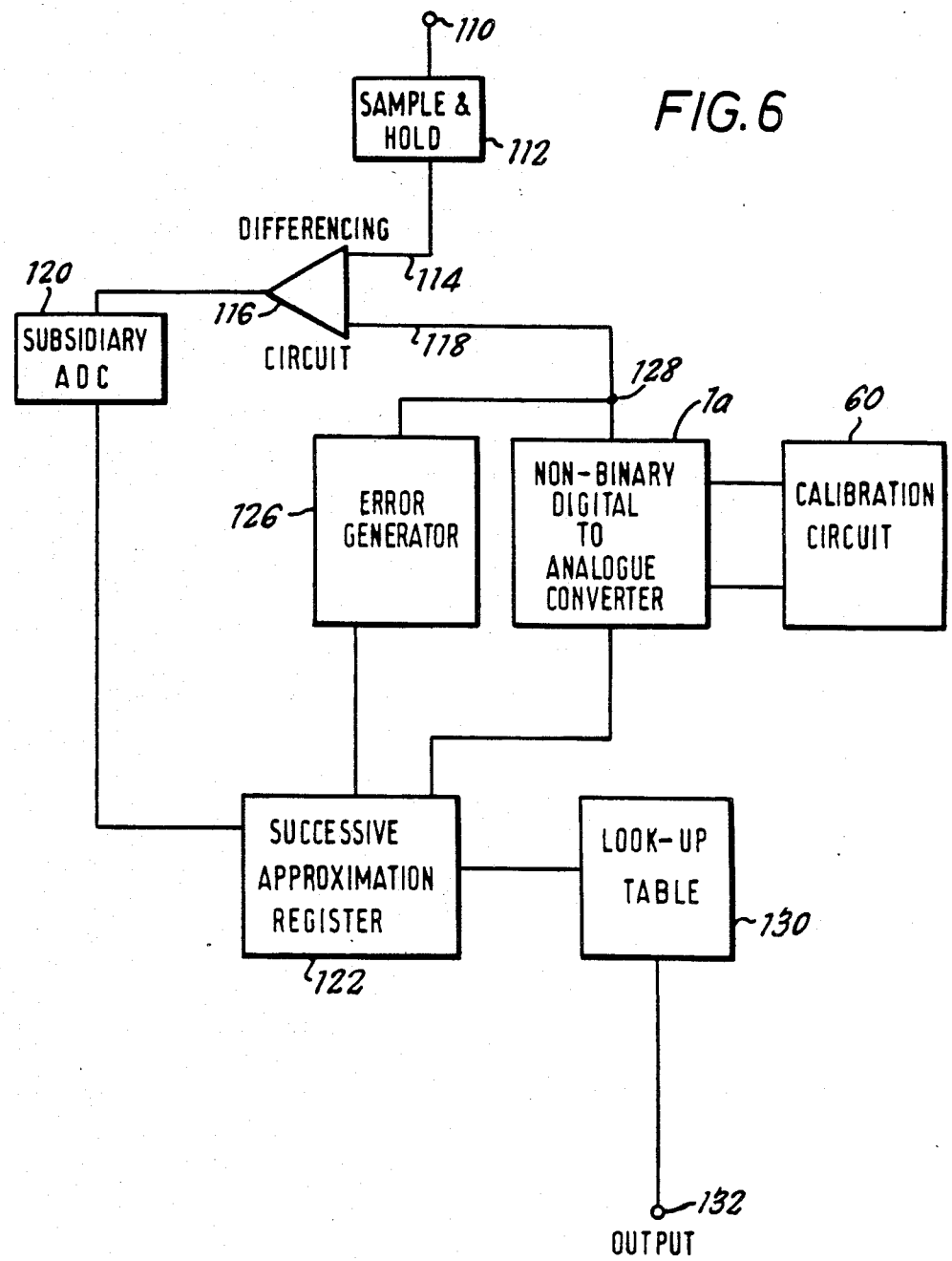
FIG. 6 illustrates a second form of analogue-to-digital converter which includes a digital-to-analogue converter in accordance with the present invention.

FIG. 6 shows an analogue-to-digital converter which is similar to that of FIG. 5 except that special provision is made to enable a digital signal to be produced correctly representing the value of the analogue sample despite the occurrence of an error such as that described above, without repeating the algorithm. Thus, in the arrangement of FIG. 6, the digital-to-analogue converter 1 is replaced by a digital-to-analogue converter 1a which is of similar construction except that the relative values of the resistors 28 in the current regulators are such that the ratio between the current produced by each regulator and that produced by the next regulator of lower significance is less than 2. The following Table IV shows a particular example of suitable current values:

TABLE IV

| | 1st Bit | 2nd Bit | 3rd Bit | 4th Bit | 5th Bit | ... | $N^{thBit}$ |
|---|---|---|---|---|---|---|---|
| Current Values ($i_n$) | 1 | 0.6 | 0.36 | 0.216 | 0.1296 | | $(1/R)^{N-1}$ |

In the above Table IV, the heading "1st Bit" indicates the current regulator corresponding to the most significant bit and the heading "$N^{th}$ Bit" indicates the current regulator corresponding to the least significant bit. The Table IV assumes a current of value unity for the regulator corresponding to the most significant bit and indicates the appropriate values for each of the subsequent bits. The symbol R represents the ratio of the current produced by the regulator corresponding to the first bit to that produced by the regulator corresponding to the second bit. Accordingly, in the Example given in Table 4 above, R is 1:0.6 and the appropriate value of the current for the $N^{th}$ bit is $(0.6)^{N-1}$.

On consideration of the above Table IV it can be seen that a current of the value produced by any of the current regulators of higher significance can be produced by summing the currents from several regulators of lower significance. Consequently, if an error as described above arises, a current of appropriate magnitude can still be produced later in the algorithm so that the correct value of the analogue signal stored in the circuit 112 can be determined without repeating the algorithm.

The error described above by way of example involved a wrong decision that the signal on input 118 was less than the signal on input 114 of the differencing circuit 116. Errors in the opposite sense may also be dealt with if, at each step in the algorithm, there is added to the output of the non-binary digital-to-analogue converter 1a an error current signal e having a value as shown in equation (1) below.

$$e = \frac{1}{2}\left[\sum_{N}^{n+1}(i_n) - i_n\right] \quad (1)$$

In equation (1) N represents the bit produced by the successive approximation register at the step in the algorithm upon which a decision is currently being taken.

Thus, an error generator 126 receives signals from the succesive approximation register 122 and generates an error current e in accordance with equation (1) at each step in the algorithm. The error current e is applied to a summing junction 128 at which it is summed with the output of the digital-to-analogue converter 1a.

In view of the non-binary relationship between the currents of the current regulators in the digital-to-analogue converter 1a, the digital number produced by the successive approximation register 122 at the time when the error produced by the differencing circuit 116 has been reduced to a value of substantially zero, is not a true representation of the value of the signal stored in circuit 112. A look-up table 130 is accordingly provided for converting the binary number produced by the register 122 at this time to a value which is a correct representation of the magnitude of the signal in circuit 112 and it is this converted binary signal which is applied to an output 132 of the circuit of FIG. 6.

Various modifications are possible within the scope of the invention. For example, although the current regulators 20, 22 and 24 illustrated in FIG. 1 have only been described as embodied in digital-to-analogue converters, such current regulators may have other applications, particularly where an accurately regulated current is required to be available over a long period of time.

Although a preferred form of the calibration circuit has been illustrated in FIG. 2, other forms of calibration circuit may be employed as appropriate. Further, although one particular and preferred measurement routine for the calibration circuit shown in FIG. 2 has been illustrated with FIG. 3, other routines are possible.

In the circuit of FIG. 1 errors detected by the calibration circuit have been corrected by adjustment of the current regulators whereas in FIG. 4 such errors have been corrected by adding an analogue correction signal to the output of the converter. Other methods of correction are possible. For example, individual analogue correction signals could be added to the currents provided by the individual current regulators. Alternatively, a digital correction signal could be added to the digital word produced by the digital circuit 2. Further, where the digital to analogue converter is employed in an analogue to digital converter then the correction could be made directly on the digital output of the analogue-to-digital circuit for example by adding an appropriate digital error signal to the output of the successive approximation register.

In the embodiment of FIG. 1, correction of the current through each current regulator is achieved by adjustment of the voltage applied to the amplifiers 44 and 46. Corrections to the currents could be achieved by other means. For example, correction resistances could be provided in each regulator which would be switched into or out of the circuit as appropriate to correct for detected errors. Although it is preferred that the calibration circuit should be permanently connected to the digital-to-analogue converter so that calibration may be carried out continuously or at regular intervals, this is not essential. Thus, a digital-to-analogue converter in accordance with the invention could be constructed merely with provision for connection to an appropriate calibration circuit.

Although the calibration circuit 60 illustrated in detail in FIG. 2 has only been shown in combination with the digital-to-analogue converter 1 or 1a, this calibration circuit may be used for measuring the outputs of other forms of digital-to-analogue converters.

Although FIG. 1 illustrates an arrangement in which corrections are applied to each of the three current regulators shown, since it is the ratio of the currents produced by the regulators which is important, it would be possible within the scope of the invention to ignore errors in one of the currents and correct errors in the other currents to maintain the correct ratios between the currents.

Although FIG. 1 shows an arrangement in which the current regulators corresponding to only the three most significant bits of the binary number to be converted are calibrated, it would be possible, in accordance with the invention, to calibrate in the same way the current regulators corresponding to all of the bits of the binary number to be converted; or to fewer than three bits.

From the foregoing, it will be recognised that the invention provides substantial advantages. Of particular importance is the provision of a digital-to-analogue conversion circuit in which calibration can be achieved without interrupting the operation thereof. It is then possible to make a DAC substantially free of thermal drift and aging effects and thus accurate substantially above 16 bits.

I claim:

1. A digital-to-analogue converter comprising:
   (a) input means for forming a digital word to be converted to analogue form;
   (b) a plurality of weighted current sources each having a first and a second end, at least two of said plurality of current sources including reference resistor means through which a weighted current value is developed and first and second isolation means interposed respectively between said resistor means and said first and second ends;
   (c) first selection means connected to said first ends of said current sources and responsive to said input means for selecting said sources in accordance with a digital word applied to said input means;
   (d) summing means for summing the currents of said selected sources to provide an analogue output signal representing said digital word;
   (e) current measuring means;
   (f) second selection means connected to said second ends of said at least two weighted current sources for selectively connecting said at least two current sources to the measuring means for measurement of their currents, said second selection means being operable independently of the operation of said first selection means and capable of applying current values from said current sources to said measuring means while current values from said current sources are being applied to said summing means;
   (g) correction means responsive to the measuring means for correcting for variations in the currents as measured by the measuring means; and
   (h) said first and second selection means and said correction means being operable concurrently and said isolation means in each of said at least two current sources maintaining the respective currents equal between the summing means and the measuring means and invariant when connected thereto by the first and second selection means thereby to provide concurrent digital-to-analogue conversion and correction.

2. A converter according to claim 1, wherein said correction means is operable to generate a correction current and to add said correction current into said analogue output signal.

3. A converter according to claim 1, wherein said second selection means is operable to select a plurality of said at least two current sources simultaneously, and including a measurement terminal arranged to sum the currents of said plurality of sources simultaneously selected by said second selection means, said current measuring means being connected to said measurement terminal to receive the sum current thereat.

4. A converter according to claim 3, including control means operable to cause second selection means to select in sequence combinations of said at least two current sources.

5. A converter according to claim 4, wherein said control means is arranged to operate said second selection means to select a sequence of combinations of said current sources which produces at said measurement terminal a sum signal of staircase waveform, and said measuring means is operable to subtract a ramp signal from said staircase waveform signal to produce a signal of sawtooth waveform and to obtain measurement data by measurement of times related to the length of the cycles of said sawtooth waveform.

6. A converter according to claim 5, wherein said control means is effective to cause said staircase waveform to rise and to fall and said measuring means is operable to obtain said measurement data both during rising of the staircase waveform signal and during falling thereof.

7. A converter according to claim 6, wherein said measuring means is operative to derive an indication of the current provided by each source from the measurement data obtained from measurement of a plurality of said times in each said sequence.

8. A converter according to claim 1, including adjustable means for adjusting the voltage across said resistive means and wherein said correction means is operable to effect said correction by adjusting said adjustable means.

9. A converter according to claim 1, wherein each said isolating means is voltage controlled.

10. A converter according to claim 9, including a reference voltage source connected between said isolating means to define the voltage maintained across said resistive means.

11. A converter according to claim 10, wherein each said isolating means comprises a field effect transistor.

12. A converter according to claim 10, wherein said reference voltage source is adjustable to provide adjustment to the voltage across the resistive means and said correction means is operable to effect said correction by adjusting said reference voltage source.

13. A converter according to claim 11, wherein each said isolating means includes a transconductance amplifier controlling the field effect transistor and said reference voltage is applied between one input of one of said amplifiers and one input of the other of said amplifiers.

14. A converter according to claim 11, wherein each said isolating means includes an operational amplifier controlling the field effect transistor and said reference voltage is applied between one input of one of said amplifiers and one input of the other of said amplifiers.

* * * * *

UNITED STATES PATENT AND TRADEMARK OFFICE
CERTIFICATE OF CORRECTION

PATENT NO. : 4,647,907

DATED : March 3, 1987

INVENTOR(S) : Storey

It is certified that error appears in the above-identified patent and that said Letters Patent is hereby corrected as shown below:

Column 1, line 60, delete "DECS" and insert --current source--.

Column 5, line 33, delete "function" and insert --junction--.

Column 9, line 46, delete "of" and insert --by--.

Column 10, line 49, delete "but" and insert --bit--.

Signed and Sealed this

Eighteenth Day of August, 1987

*Attest:*

DONALD J. QUIGG

*Attesting Officer*     *Commissioner of Patents and Trademarks*